United States Patent [19]

de Rudnay

[11] Patent Number: 4,748,313
[45] Date of Patent: May 31, 1988

[54] APPARATUS BY THE CONTINUOUS VAPORIZATION OF INORGANIC COMPOSITIONS BY MEANS OF A PHOTON-GENERATING THERMAL SOURCE OF RADIATION HEAT

[75] Inventor: Andre de Rudnay, Lausanne, Switzerland

[73] Assignee: Elektroschmelzwerk Kempten GmbH, Munich, Fed. Rep. of Germany

[21] Appl. No.: 897,549

[22] Filed: Aug. 15, 1986

[30] Foreign Application Priority Data

Aug. 23, 1985 [DE] Fed. Rep. of Germany ....... 3530106

[51] Int. Cl.⁴ ............................................. H05B 3/00
[52] U.S. Cl. .................................... 219/271; 219/275; 118/726
[58] Field of Search ............... 219/271, 272, 273, 274, 219/275, 276, 553; 432/262, 263; 118/726, 727; 427/49, 50, 51, 52; 422/125, 305, 306

[56] References Cited

U.S. PATENT DOCUMENTS

| | | | |
|---|---|---|---|
| 3,129,315 | 4/1964 | Radke | 219/271 |
| 3,153,137 | 10/1964 | Drumheller | 219/271 |
| 3,563,202 | 2/1971 | Macrael | 219/271 |
| 3,662,154 | 5/1972 | Harra | 219/271 |
| 4,002,880 | 1/1977 | Davey | 219/275 |
| 4,482,799 | 11/1984 | Pricenski | 219/275 |

OTHER PUBLICATIONS

Cosgrove, J. F. et al., "Single-Heater Multi-Material Evap. Source", IBM Tech. Disc. Bull., vol. 24, No. 12, May 1982, pp. 6423-6425.
Archibald, P., "Source Evaporant . . . ", Solid State Tech., Jul. 1976, pp. 32-40.

*Primary Examiner*—E. A. Goldberg
*Assistant Examiner*—Teresa J. Walberg
*Attorney, Agent, or Firm*—Burgess, Ryan & Wayne

[57] ABSTRACT

An apparatus for the vaporization of inorganic compositions uses a photon-generating thermal source of radiation heat in a continuously operated vacuum vaporization processes. The apparatus includes a shaped body of the compacted vaporizable material prepared from pulverulent inorganic compositions having melting points greater than 1000° C., optionally mixed with elements having melting points greater than 1000° C., and a thermal source of radiation heat, the vaporizable material and a thermal source of radiation heat being coupled without contact. The vaporizable material is constructed as preferably a porous, shaped body and the shaped body and/or the thermal source of radiation heat are movably arranged relative to each other.

8 Claims, 7 Drawing Sheets

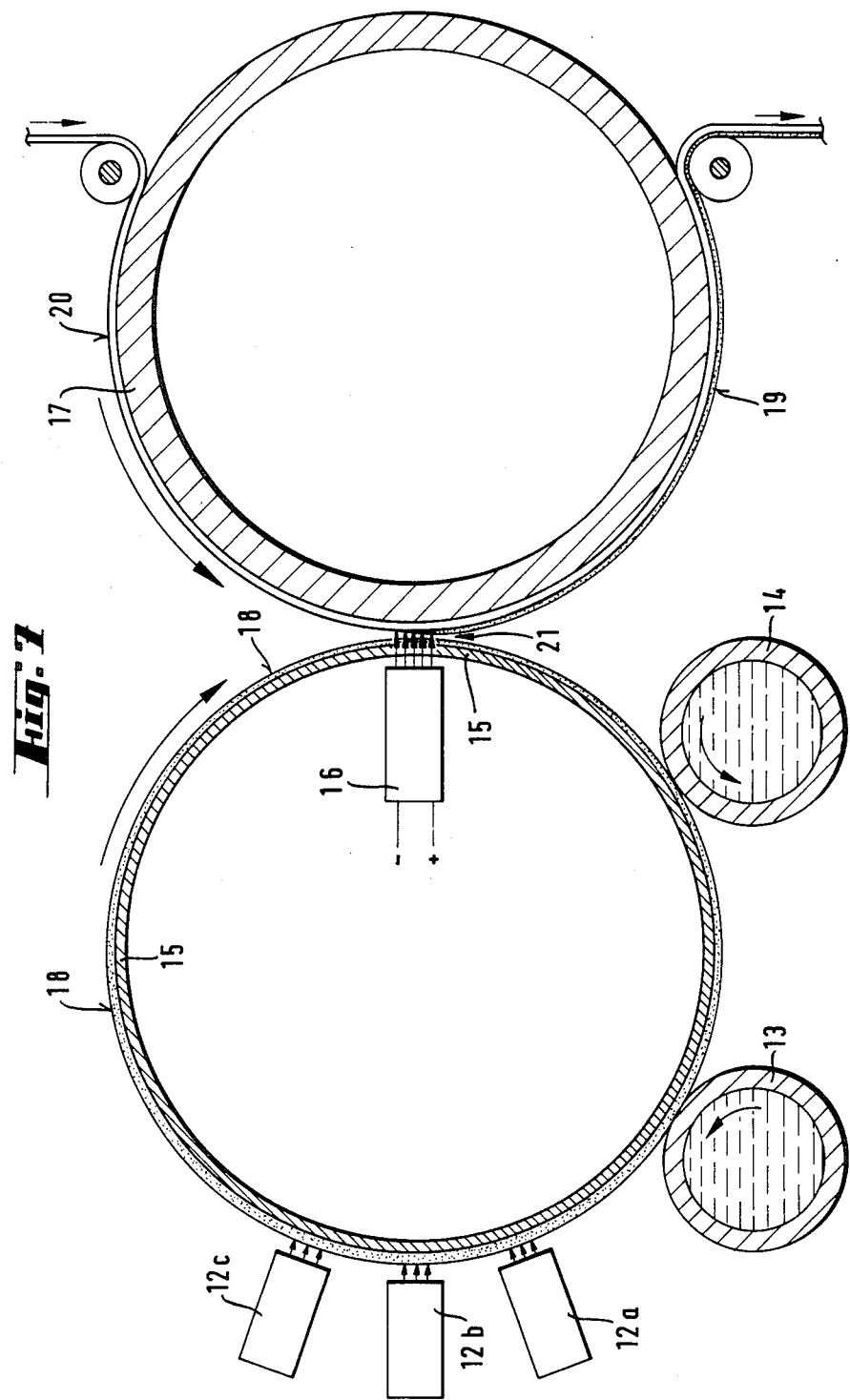

APPARATUS BY THE CONTINUOUS VAPORIZATION OF INORGANIC COMPOSITIONS BY MEANS OF A PHOTON-GENERATING THERMAL SOURCE OF RADIATION HEAT

BACKGROUND OF THE INVENTION

It is known that by means of expensive cathodic sputtering a large number of high-melting point compositions can be vaporized and condensed continuously in film coating plants in a process that lasts many hours.

However, no process is known for continuously evaporating unto a moving web a pore free coating of a simple chemical composition at high speed and in particular high-melting temperature inorganic compounds such as zinc sulfide, silicon nitride, titanium dioxide, silicon monoxide, chromium oxide and electricity conducting or non-conducting silicate glasses. Although there are several types of vaporization sources capable of vaporizing either molten or solid vapor material, the vaporization rate is low due to a small vapor emitting surface of the material being vaporized. The rate of vaporization of the high melting point material in the known processes is too low for continuous vapor deposition on a large scale where film speeds of up to 10 linear meters per second and higher are required. In addition, the vaporizer vessels conventionally used for accommodating the material being vaporized are quickly destroyed by contact corrosion. It has not hitherto been possible to vapor coat a single reel having 10,000 linear meters of film with a cohesive poreless layer of a composition such as silicon monoxide.

Expensive electron beam vaporization methods cannot be used since cavitation or implosion effects permit only discontinuous vaporization of compositions such as silicon monoxide. Even with the aid of a high-power laser as the energy source, in an apparatus in which vaporization is carried out in a cold crucible so that crucible reactions are prevented, it has only been possible to discontinuously produce films coated with silicon dioxide (see DE-A-16 21 306).

Another disadvantage of the known vaporization materials and vaporization apparatus for high-melting compositions is the often low quality of the deposited coating. Besides being very porous, the coatings do not adhere to the substrate since the vaporized molecules, in the best of cases, approach the substrate with a low kinetic energy corresponding only to the vaporization temperature. It has often been necessary to impregnate and strengthen the coating of silicon monoxide or silicon dioxide, for instance, with an additional layer of a compound containing silicone polymerized in a glow discharge.

Even in a careful vaporization from a resistance-heated vaporization vessel, it has been possible only at very low vaporization rates and by use of multiple vaporization chambers to prevent the formation of small holes that result by the perforation of the film by small solid or molten particles ejected from the vaporization vessel. In addition, known vaporization materials and apparatus, due to the low rate of coating formation because of the low vaporization rate and the crystal formation favored thereby, do not provide X-ray amorphous coatings. Amorphous coatings are of great importance, for instance, as additional layers for inhibiting gas and vapor diffusion in aluminum vapor-plated packing sheets, catalyst poison for autoregenerative capacitors, color and protective layers for hot stamping foils and other ornamental sheets, electronegative covers for edges of metal layers subject to spark erosion, capacitor insulators and weather-resistant protective coatings for aluminum vapor-plated radar screens.

In the known apparatus for vaporizing high-melting compositions such as SiO or ZnS, by means of a thermal radiation heat source, the material to be vaporized in solid form generally consists of a powder or a granulated material or a self-supporting block or mass. The thermal source of heat, usually a tungsten filament, is positioned in a cavity within the material to be vaporized. The heat source is generally in the shape of a hairpin and vaporized molecules escape from the cavity through an outlet opening (see U.S. Pat. No. 2,762,722).

In other embodiments, the material to be vaporized, in granulated form, is housed in a cylindrical container. The source of heat generally in the shape of a perforated pipe or spiral heated filament is vertically arranged in the container so that the vaporized molecules can escape upwardly through the cavity within the pipe or heated filament (see U.S. Pat. No. 3,129,315 and U.S. Pat. No. 3,153,137). Such an embodiment has become known in the literature by the designation "Drumheller apparatus".

An apparatus is also known wherein a powdery vaporizable material is present in a replaceable container situated within a heated cylinder. The heated cylinder is outwardly screened by heat by heat shields so that the vaporized molecules can escape only upwardly and can be additionally heated quickly by a second heat source in the form of a grid (see U.S. Pat. No. 3,104,178).

An apparatus in which the granulated vaporizable material is housed in a heated cylinder with a perforated inner wall having a tungsten filament positioned in the interior of the heated cylinder can also be operated with an additional energy supply in the form of an electron carried in a manner such that the vaporization can be effected not only by thermal radiation but also by electron radiation. A specially uniform vaporization and less undesirable sputtering of molten particles can be obtained (see U.S. Pat. No. 3,244,857).

Finally, an apparatus for the vaporization of high-melting metals such as chromium is known in which the vaporizable material is in the form of a compact bar mounted on a solid support. The bar and support are positioned within a source of radiation heat such as a hollow cylinder of tantalum plate (see U.S. Pat. No. 3,313,914).

In all the known apparatus, however, the vaporizable material is stationarily arranged in solid form independently of whether it is housed in a container as a powder or a granulated material or is compacted as a self-supporting solid body. The vaporizable material is coupled without contact with a source of heating radiation which is stationarily arranged. Such apparatus with a stationary arrangement of the vaporizable material and the source of radiation heat can be used in conventional vacuum vaporization equipment for the discontinuous vaporization of a few high-melting compositions in the amount required for a specific operation. The device can be operated to provide "splatter-free" vaporization with high kinetic energy of the vaporized molecules at a high vaporization speed. Apparatus of the known kind are not suitable for a continuously operated vacuum vapor-deposition operation in which a large amount of vaporizable material is required since the temperature of the source of radiation heat must be continuously increased as the vaporizable material is consumed to ensure uniform vaporization at a constant vapor pressure. The need for increased temperature leads to local overheating of the source of heat and often to premature destruction thereof. Even worse, some compounds, such as silicon nitride, will decompose on heating in vacuum into nitrogen gas and elementary silicon, the evaporation of the latter being retarded until most of the nitrogen gas has distilled off and pumped off by the vacuum pumps. But if the silicon nitride is being continuously fed towards the thermal radiation heater, the evaporation of silicon will be accompanied by the evolution of nitrogen gas originating from the silicon nitride not yet directly exposed to the radiation of the heater, so that the silicon directly exposed to and evaporated by radiated heat will re-absorb or getter nitrogen when condensing on the web or other moving target.

Also, many powder mixtures containing transition metals will on heating in vacuum form not one single, but a variety of compounds having different vapor pressures, so that the lower vapor pressure compounds will distill off last, and the result will be a non-homogenous condensed layer. Thus, when a mixture of 3 parts per weight of $Cr_2O_3$ with 1 part per weight Si is heated in a static vacuum evaporation system, by a radiation heater heated to about 1800° C., the compound first evaporating and condensing will be more of a dielectric than a conductor of electricity, but after the rate of evaporation has decreased and the heater temperature consequently increased to say 2000° C., the condensed layer becomes gradually more conducting and optically absorbing. If however the same mixture is being continuously fed to the same radiation heater heated to say 1800° C., the condensed layer will consist of a homogenous, electrically conducted glass.

The problem is to provide an apparatus for the vaporization of high-melting inorganic compositions by means of a photon-producing thermal source of radiation heat in a continuously operated vacuum vapor-deposition process, which apparatus makes possible the uniform "splatter-free" vaporization of the high-melting composition for coating a substrate from a large stock of vaporizable material, without premature destruction of the thermal heat source by local over-heating, or condensing layers of unwanted composition of non homogenous nature.

BRIEF DESCRIPTION OF THE INVENTION

The apparatus of the present invention comprises vaporizable material in the form of a shaped body. The vaporizable material in the form of a shaped body is prepared by compacting and molding at least one pulverulent inorganic composition having a melting point greater than 1000° C. or from a mixture of at least one pulverulent inorganic composition having a melting point about 1000° C. and at least one pulverulent elemental material having a melting point of above 1000° C. The thermal source of radiation heat and the vaporizable material are coupled by radiation without contact.

According to the present invention, the vaporizable material is shaped as at least one, preferably porous, shaped body, and the shaped body and/or the thermal source of radiation heat are movably arranged relative to each other.

DETAILED DESCRIPTION OF THE INVENTION

The apparatus according to the present invention can be constructed in a manner such that the shaped body or the thermal source of radiation heat or both are moveable, in relation to each other, during the vaporization of the high melting point composition. In a simple construction of the apparatus, there are preferred embodiments in which only the shaped body is movably arranged and the thermal source of radiation heat is immovably or stationarily arranged.

The preferable porous shaped bodies used as the source of vaporizable material, according to the invention, can have any desired shape and size. The shaped bodies are preferably designs as hollow bodies. The weight of the shaped bodies is generally in the range of about 10 to 100 g, but shaped bodies of other weights can be used. The size of the pores present should be at least in the range of the light wave length to permit penetration of the photons from the source of radiation heat and the vapor-producing surface must be large enough to ensure uniform vaporization at high vaporization rates. The porous shaped bodies must be sufficiently stable so that they can be manipulated during the vaporization to provide a continuous supply of vaporized material.

The porous shaped bodies can be made from a pulverized starting material by known molding processes. To ensure easy molding, the powder or powder mixtures can be mixed with a temporary binder or dispersed in a solvent. However, the use of a temporary binder is not required. The molding can be carried out at room temperature or at elevated temperature by conventional methods such as forge pressing, isostatic pressing, injection molding, extruding or slip casting. After molding, the porous shaped bodies are preferably subjected to a thermal treatment by heating to at least 500° C. The thermal treatment strengthens the porous shaped body and practically complete degasification can be obtained. The additional strengthening of the vaporizable material is to be understood to include solid agglomeration or sintering and prevents during the vaporization process, undesirable "splattering" or splashing of solid or molten particles that is often observed when vaporizing a material comprising a loose powder or a granulated material. The degasification of the vaporizable material is particularly advantageous in the continuous feeding from a storage means. The degasification during the preparation of the shaped bodies provides a source of high melting point material which does not require degasification during the vaporization process. Degasification during the vaporization process can lead to premature destruction of the photon source by conversion to volatile compounds by reaction with oxygen.

As used herein, shaped body or porous shaped body refers to shaped forms or articles as distinguished from pulverulent materials such as powders, granules and the like. The shaped body or porous shaped body must be of sufficient size to furnish a significant size to provide a significant amount of vaporizable material and be adaptable for being coupled by radiation without contact to the radiation heating source. Hollow shaped forms and solid shaped forms are contemplated within the scope of the invention. The shaped body or porous shaped body is generally of a size to accomodate a portion of the radiation heating source without contact therewith.

A known heat source which comprises a high-melting point wire or rod, preferably constructed with low inductance, can be used as the thermal source of radiation heat for generating the photons. Examples of known heat sources include radiation heating elements having a meander shape or are double wound.

The apparatus according to the invention preferably comprises a movable arrangement of the vaporizable material having a porous shaped body so as to provide the comparatively simple construction of the vaporization apparatus suitable for continuous vaporization of more than 1000 grams of high-melting point compositions. The vaporizable material can be formed as a porous hollow body positioned in a holding device comprising a hollow chamber with openings which simultaneously serve as a radiation protector. The source of radiation heat is positioned within the hollow body and is coupled thereto without contact.

If storage means for the feeding of shaped bodies of vaporizable material are mounted on the hollow chamber, they can be moved in any direction either mechanically or by gravity.

According to a preferred embodiment of the invention, the vaporizable material is designed in the shape of a hollow cylinder such as a jacket or ring and is coupled, without contact, to a coaxially immersed heating coil. The hollow cylinders are housed in a jacket of steel or other high-melting point material that serves as a holding device. The jacket is movably disposed so that it can move together with the hollow cylinders during the vaporization process. The hollow cylinders, however, can also be movably disposed in a firmly mounted supporting jacket so as to be able to move only during the vaporization process. The thermal stress on the supporting jacket is comparatively low since the vaporizable material itself absorbs the heat necessary for vaporization and serves, at least partly, as a heat insulator.

The movable arrangement of the hollow cylinders with or without a holding device with the heating coil immovably arranged ensures that unconsumed vaporizable material is continuously provided during the vaporization process and thereby local over-heating of the heating coil is prevented.

According to another embodiment of the invention, the vaporizable material is designed as a solid body which is coupled by radiation without contact, from the outside, with a source of radiation heat. The solid body is movably positioned on a support and is progressively hollowed out or tunnelled in situ, in the course of the vaporization process, due to the vaporization of the material by the source of radiation heat itself. To facilitate the hollowing out or tunnelling due to the radiation effect, the source of radiation heat can be designed with preferably an elevated radiation emission at the tip, which can be obtained, for instance, by compact winding of a tungsten coil used as a source of heat or tapering of the latter as, for example, by electrolytic polishing. In addition, the massive body can be provided on its surface with indentations, being coupled, without contact, with a heating coil immersed in said indentations. It is also insured in this embodiment that unconsumed vaporizable material is continuously delivered by moving the shaped body in the direction of the stationarily arranged source of heat.

Another important contribution for obtaining the desired large vaporizing surface of the vaporizable material results from the preferred porosity of the shaped body. The porosity provides an effective surface which is considerably larger than the visible surface and has many small depressions in the form of cavities that are especially well suited to trap photons. The demands on the radiation heating elements become especially great and in order that they can provide a high radiation density, the radiation surface of the radiation heating element should preferably not be smaller, or not considerably smaller, than the apparent surface of the radiated part of the vaporizable material, especially when there are used vaporizable materials of low volatility such as the oxides of cerium or titanium.

The high temperature of the photon-radiating source favors the generation in situ, that is, in the course of the vaporization process, of high melting, in part hitherto unknown, chemical compositions from different solidified powder mixtures. It is possible, as an example, to vaporize from a known mixture of silicon with silicon dioxide (highly dispersed silica), a desired reaction product, silicon monoxide, due to the reaction heat resulting at temperatures of less than 1000° C. of the vaporizable material. Mixtures of powders of high melting volatile elements that produce oxygen compounds such as B, Cr, Fe, Ge, Mo, Nb, and Si with compounds that emit oxygen when heated in vacuum such as certain oxygen compounds of Co, Cr, Fe and Si are suited for the production of a large number of coatings hitherto unknown in the continuous vaporization method and especially in the film coating vapor-deposition method. Thus, it is possible for example, to evaporate homogenous, electrically conducting glasses from mixtures of Si and $Cr_2O_3$, while such glass coatings could so far been only condensed on moving webs when the mixtures were first melted in an inert gas, and the solidified melt used as a cathode in a cathodic sputtering process.

A reactive vaporization such as the conversion of silicon monoxide to silicon dioxide can, for example, be carried out as follows: silicon monoxide is vaporized in high vacuum from a vaporizable material of hollow form with a source of radiation heat immersed therein without contact. As soon as the SiO vapor flowing out of the cavity reaches the desired intensity, there is introduced in the vacuum apparatus, oxygen at the partial pressure required, for instance about 4.0 Pa. Since the partial pressure of the oxygen is much lower than the vapor pressure of the SiO vapor flowing out from the cavity-shaped vaporizable material, the oxygen cannot corrode the source of heat that consists, for instance, of tungsten. Accordingly, the continuous reactive vaporization is made possible since the source of heat is not noticeably corroded by the SiO vapor.

In certain uses such as in the simultaneous deposition of several layers in a vapor-deposition film coating plant, it can be advantageous to arrange separate evaporators in horizontal or oblique or vertical positions. In order that the vaporizable material be securely held or guided and that no portions therof fall on the source of heat, there is provided the possibility of movably arranging the vaporizable material on a support or connecting the two in a manner such that the vaporizable material and the support can be moved together.

The jacket and cylinder shape of the preferably porous shaped body allows the use of a vaporizable material in vaporization processes additionally equipped with electron beam guns. Thus, the cylinder or cylinders can, for instance, be mounted on a rotatable axle or roller preferably provided with a heating device for the purpose of degasification. By slowly rotating the device, the vaporizable material is uniformly vaporized by photon and electron bombardment. Not only a cylinder from the outside but also a hollow body from the inside can be additionally bombarded and vaporized with electrons, as, for instance, by applying an adequate voltage between a cathode consisting of a tungsten coil which is simultaneously a photon source and an anode that is simultaneously a radiation protective plate, and vaporizing the hollow vaporizable material by the combined action of electrons and photons. It has been found that discharges are prevented by the intensive vaporization; otherwise they can be prevented by known means such as magnetic fields.

The apparatus according to the invention having a movable arrangement of the vaporizable material consisting of a porous shaped body and a stationary arrangement of the thermal source of radiation heat is especially useful for use in continuously operated film coating processes since it is possible to vaporize evenly over their whole width, wide substrates consisting, for example, of plastic or paper foils.

In addition, the uniformity of the coating can be further enhanced by a double vaporization process which comprises first vaporizing a vaporizable material comprising a high-melting metal or similar composition to provide a coating on a first substrate and in a second vaporization process that is separate or takes place in the same vacuum plant, apparatus transferring the coating layer on the first substrate by conventional methods (electron bombardment, photon radiation or resistance heating) to a second substrate that is, the final, foil-like substrate. If a steel or molybdenum belt, for instance, which is secured to a slowly rotating roller is coated with a SiO layer which is not quite uniform, is again heated, during the rotation, at a moment when it is parallel with and in the proximity of a guide roller carrying a plastic foil, then part of the condensed SiO layer can uniformly be transferred to the plastic foil since the unevenness in the thickness of the SiO layer deposited on the metal band is very small compared to the distance between the metal band and the plastic foil on the guide roller. A condition for the desired uniform foil coating, formerly obtainable only by means of the costly and slow cathodic sputtering, is of course that the first carrier that is, the metal band in the case described, be very uniformly heated and dimensioned so as to project somewhat beyond the foil edge in order to avoid any decrease in the thickness of the coating at the edge of the foil. The novel two-step transfer process is particularly useful for production of improved coated products formerly unknown in the film coating art. The process can be combined with a conventional metallization process and it can be used to simultaneously transfer several layers of the improved coating to the same final substrate. Accordingly, new interference filters, ornamental foils, engraved foils coated on plastic foils in which the entire coating has been vaporized including the metal layer, can be produced by the present process thus substituting for the colored or uncolored lacquer layer, a significantly better and cheaper inorganic layer that requires no solvents which are deleterious to the environment. It is thus possible to produce a long-known effect by a novel and simple means.

An undesirable chemical reaction of the transferred layer with the carrier band practically does not occur since the reaction products formed from the mixtures comprising the shaped bodies are in general less corrosive than the individual components of the mixtures. In addition, the layers condensed on the carrier band adhere to the band and can be easily heated.

The object of the invention is explained in detail with reference to FIGS. 1 to 7.

FIG. 7 illustrates the arrangement of an apparatus according to the invention of a continuously operating vapor coating plant for a double vaporization process.

Figure 1:
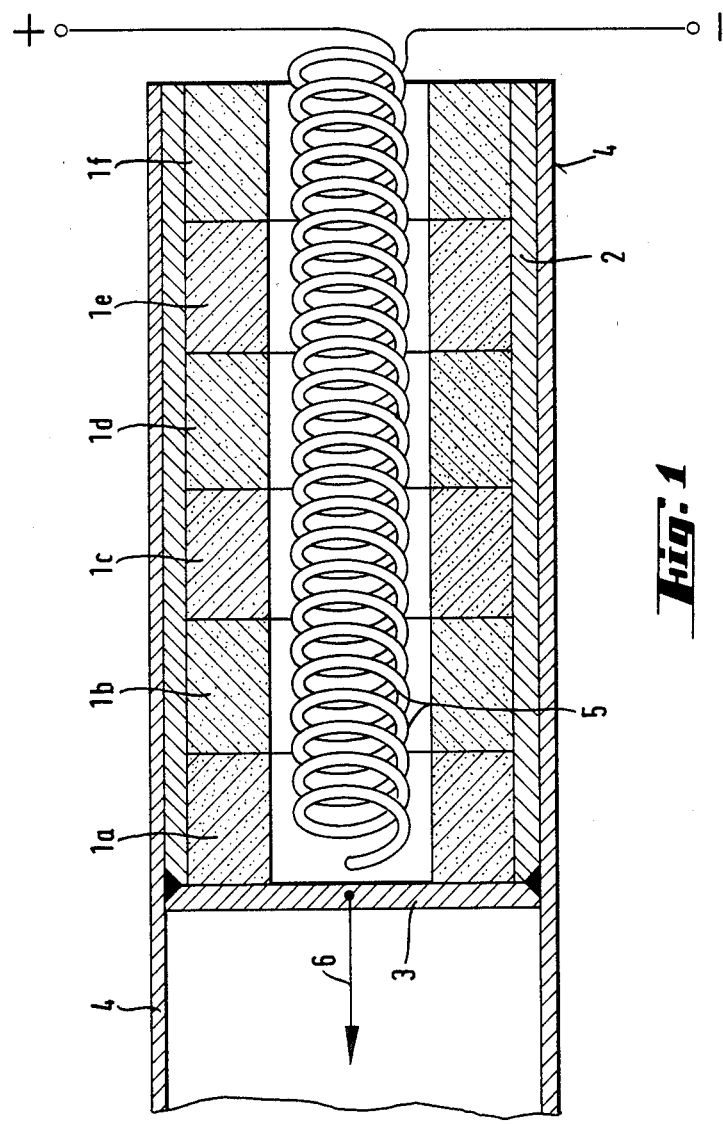
FIG. 1 illustrates a horizontal operating embodiment of the apparatus in longitudinal section at the start of the operation.
Figure 2:
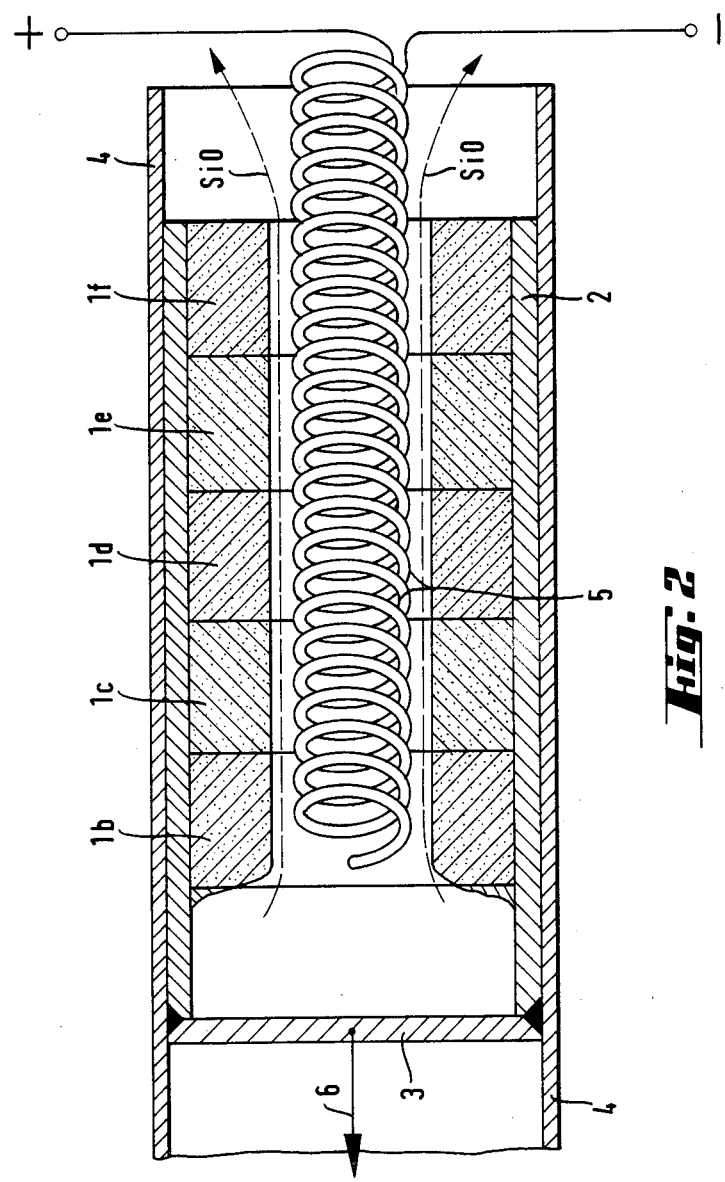
FIG. 2 illustrate the apparatus according to FIG. 1 in an intermediate working position.

Regarding FIGS. 1 and 2:

In the horizontal steel jacket 2 having a length of 200 mm, an outer diameter of 50 mm and an inner diameter of 46 mm and closed at one end by a welded-on steel bottom 3, there are positioned porous rings of vaporizable material 1a to 1f. The rings of vaporizable material were produced by extrusion of a powder mixture comprising one part by weight Si and two parts by weight $SiO_2$ (FIG. 1). The vaporizable material was degasified by heating the steel jacket together with its contents for a few minutes with access to air, to 500° C. prior to being movably arranged in the second steel jacket 4 that serves as a carrier jacket so as to enable it to move in the direction of arrow 6. The source of radiation heat 5 is a tungsten filament having a diameter of 3 mm and a length of 2000 mm, which, by a double tight winding, is shaped to form a coil having an inner diameter of 20 mm. The coil 5 is introduced through the open end of the first steel jacket 2 so as not to contact the vaporizable material rings 1a to 1f and it ends about 10 mm from the bottom 3 in which position it is fixed. When using this apparatus in a continuous vaporization process operated under a pressure of 0.0133 Pa and heating of the source of radiation heat 5 to about 1800° C. by resistance heating, the vaporizable material, which is adjacent the bottom 3 and has been most strongly heated through the end of the heating coil 5, begins to vaporize. After consumption of said ring 1a with formation of SiO vapor that escapes through the open end of the steel jacket 2, said steel jacket 2 moves in the direction of arrow 6 (FIG. 2) so that now the vaporizable material ring 1b starts to vaporize. By further drawing into the carrier jacket 4, in the direction of the arrow 6, the steel jacket 2 with the rings of vaporizable material situated therein, the rings 1c to 1f can thus be successively vaporized. Due to the continuous delivery of vaporizable material, the performance of the source of radiation heat 5 and thus its energy requirement, remain unchanged. In this manner, the overheating and thus the premature destruction of the source of radiation heat 5, are effectively prevented. It has been found that by this embodiment of movably arranged vaporizable material and the stationary mounted source of radiation heat, there can be obtained for the source of radiation heat, service periods of more than 100 hours. In addition, the steel jacket 2 loaded with the rings of vaporizable material 1a to 1f can be rotated during the vaporizable process whereby a specially uniform heating of the inner surface of the rings of vaporizable material is obtained.

Figure 3:
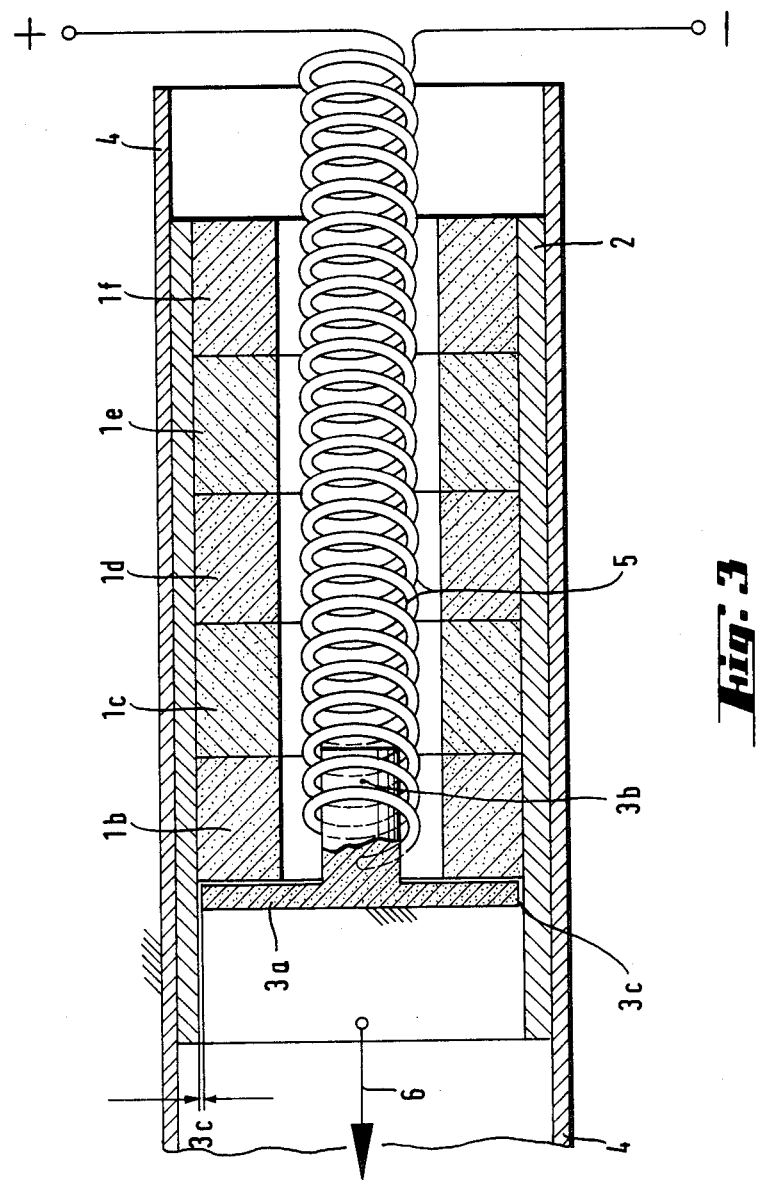
FIG. 3 illustrates a second horizontal operating embodiment in longitudinal section.

In FIG. 3 is shown an embodiment wherein the source of radiation heat 5 is supported at the end that is, at the bottom side, by a bottom 3a of sintered ceramic with a supporting pin 3b. The steel jacket 2 can slidingly move around said stationary bottom 3a by virtue of a small play 3c.

Figure 4:
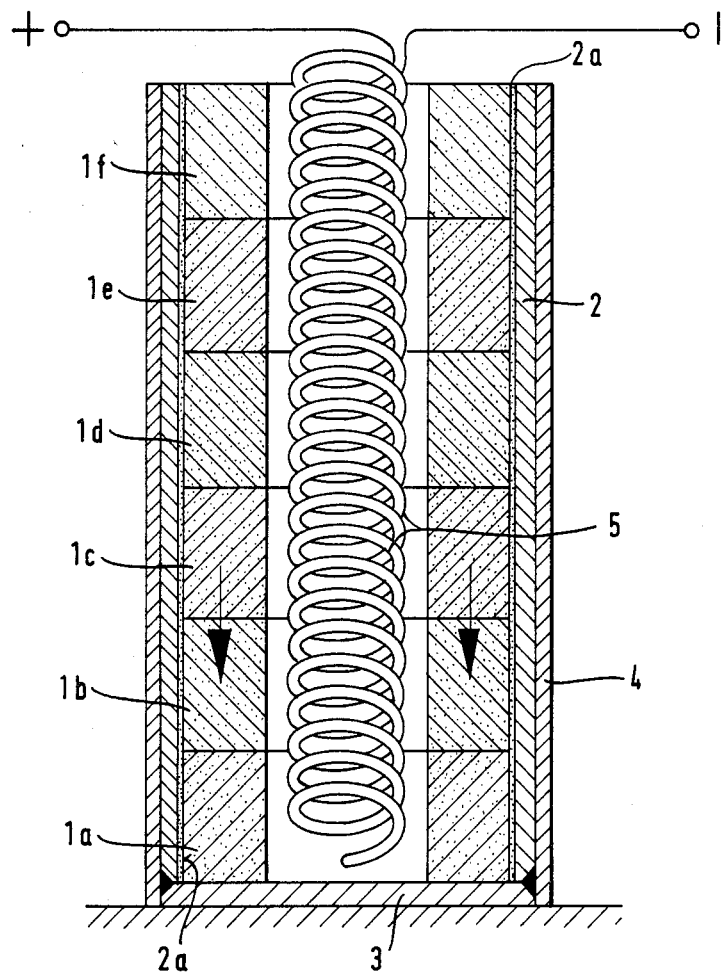
FIG. 4 illustrates a vertical operating embodiment in longitudinal section.

In a vertical arrangement of the vaporization apparatus according to FIG. 4, the steel jacket 2 and the bottom 3 can be stationarily mounted in the vapor coating apparatus so that only the rings of vaporizable material 1a to 1f are moved by gravity after the lower ring has vaporized.

It is preferable in this embodiment to provide between the rings of vaporizable material 1a to 1f and the steel jacket 2, a sliding layer 2a which can comprise materials such as pure hexagonal boron nitride powder.

The arrangements according to FIGS. 1 to 3 can also be operated vertically.

Figure 5:
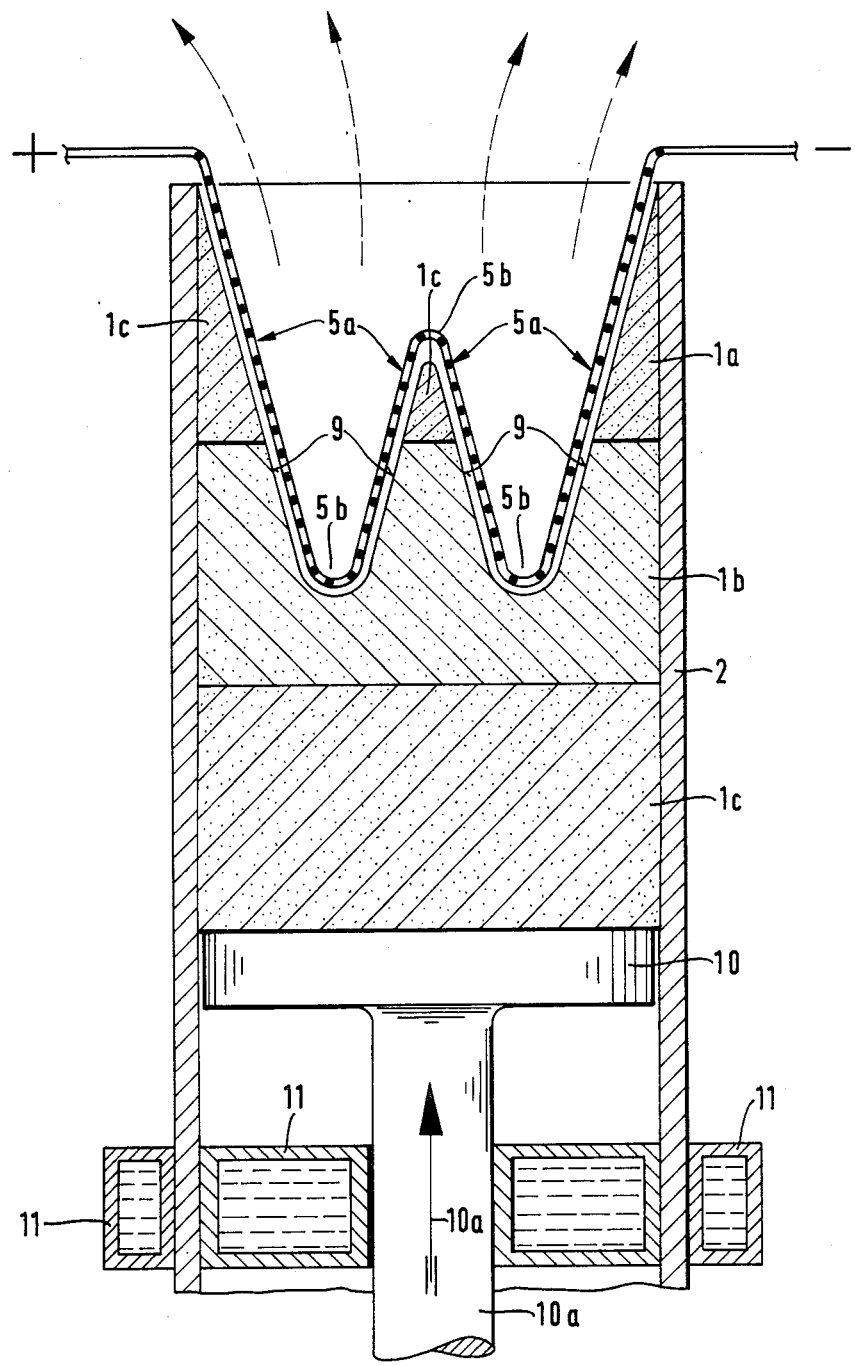
FIG. 5 illustrates a second vertical operating embodiment in longitudinal section.

FIG. 5 illustrates an embodiment which can be used horizontally or vertically.

In the four sided container 2 made of a high-melting point material, there is introduced disk-like layers or one piece of vaporizable material 1a which is formed into the shape of the container.

Figure 6:
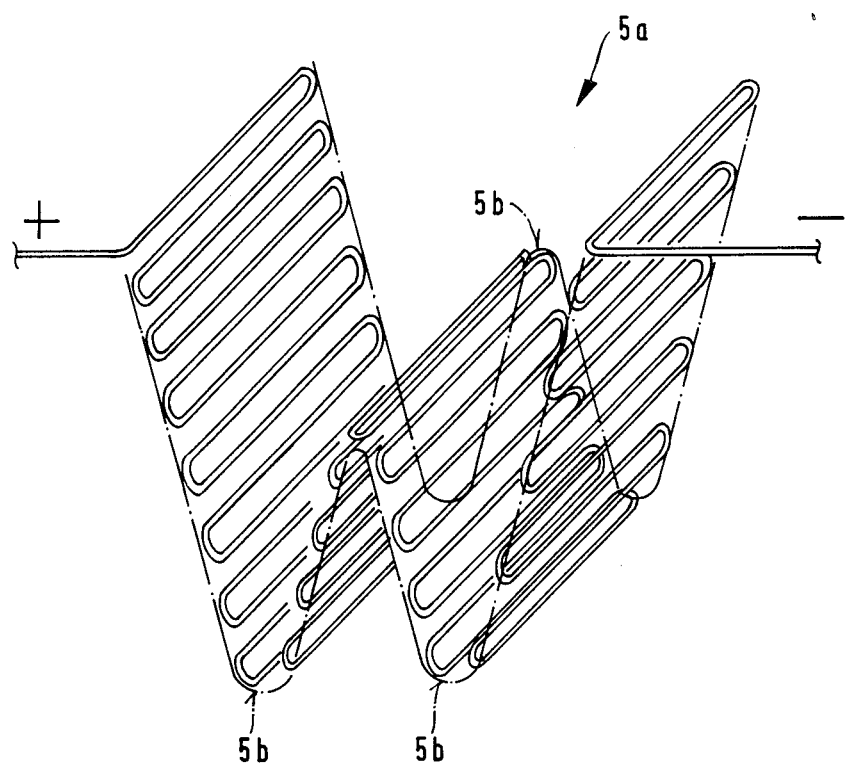
FIG. 6 illustrates in perspective, the source of radiation heat of FIG. 5.

At the upper open end of container 2, a source of radiation heat 5a is introduced. The source of radiation heat has a double meandering shape, as shown in perspective in FIG. 6.

A piston 10 supplies the vaporizable material in the direction of the arrow 10a to the source of radiation.

A cooling device and seal means 11 cools the container 2 to permit fast cooling after evaporation.

When using this apparatus in a continuous vaporization process operated under a pressure of 0.0133 Pa and heating the source of radiation heat 5a to 1800° C. or more by resistance heating, the vaporizable material in the indentations 9 of the solid body 1a starts to vaporize forming vapor which escapes upwardly.

By pushing the solid bodies 1a, 1b and 1f in the direction 10a of the arrow that is, in the direction of the tapered tip 5b of the source of radiation heat 5a, the vaporizable material is further eroded and vaporized in a wedge shape due to the radiation heat. Convenient feeding devices for solid evaporants are known, see e.g. U.S. Pat. No. 2,153,786. It is understood that the feeding device shall be preferably linked to and commanded by one of the many evaporation monitoring devices. Many such devices are described in current literature, e.g. in the latest edition of Kirk-Othmer: "Encyclopedia of Chemical Technology".

FIG. 7 illustrates the transfer coating process of the present invention.

The jacket-like carrier 15, which rotates clockwise by contact with the rotating water-cooled carrier rollers 13 and 14, is coated by material vaporized by vaporization apparatus 12a, 12b and 12c, which, according to the invention, comprises movably arranged vaporizable material and/or stationarily arranged source of heat according to the above described embodiments. A narrowly defined portion of the coated heat conductive carrier 15 is heated by an electron gun 16 and a portion of the primary coating layer 18 on the carrier 15 is thereby transferred in the direction 21 to the foil 20 carried on guide roller 17. When the coating layer 18 on the carrier 15 is of sufficient thickness, the thickness and uniformity of secondary layer 19 transferred to the foil 20 on guide roller 17 is only determined by the emission of the electron gun 16 and the relative speeds of the carrier roller 15 and of the guide roller 17. That is, when the thickness of coating 18 on carrier roller 15 is greater than the amount transferred to foil 20 by the heat of electron gun 16, the coating 19 on foil 20 is uniform and its thickness is determined by the heat provided by the electron gun and the relative speeds of roller 15 and 17.

We claim:

1. An apparatus for the vaporization of high-melting point inorganic compositions by means of a photon-generating thermal source of radiation heat in a continuously operated vacum vaporization apparatus which comprises: compacted vaporizable material in the form of a shaped body having an interior portion prepared from at least one pulverulent inorganic composition having a melting point greater than 1000° C. or a mixture of at least one pulverulent inorganic composition having a melting point greater than 1000° C. and at least one pulverulent element having a melting point greater than 1000° C.; a thermal source of radiation heat, coupled without contact, to said interior portion of said compacted shaped body of vaporizable material; and means to move at least one of said shaped body and said thermal source of radiation heat in relation to each other while the body is being heated.

2. An apparatus according to claim 1, wherein said compacted vaporizable material is constructed as at least one porous shaped body.

3. An apparatus according to claim 1, wherein said compacted vaporizable material is constructed as at least one shaped body, said shaped body being arranged movably in relation to said thermal source of radiation heat arranged stationarily.

4. An apparatus according to claim 1, wherein said compacted vaporizable material is constructed as at least one hollow shaped body, said hollow shaped body being movably arranged in relation to said thermal source of radiation heat arranged within said hollow body.

5. An apparatus according to claim 4, wherein said compacted vaporizable material is constructed as a shaped body comprising at least one porous hollow cylinder coupled without contact with a coaxially immersed radiation heating coil.

6. An apparatus according to claim 1, wherein said compacted vaporizable material is constructed as at least one solid shaped body, said solid shaped body being arranged movably and said thermal source of radiation heat being arranged stationarily outside said solid shaped body; said thermal source and said solid body being arranged to that the thermal radiation source tunnels into said shaped body.

7. An apparatus according to claim 6, wherein said compacted vaporizable material is constructed as a solid porous shaped body with indentations on the surface and is coupled without contact with a heating coil immersed in said indentations.

8. An apparatus according to claim 1, characterized in that said compacted vaporizable material is movably arranged upon a carrier or connected with a movably arranged carrier in a manner such that said vaporizable material is continuously delivered to said stationarily arranged source of radiation heat.

* * * * *